United States Patent [19]

Mostafazadeh et al.

[11] Patent Number: 5,598,321
[45] Date of Patent: Jan. 28, 1997

[54] BALL GRID ARRAY WITH HEAT SINK

[75] Inventors: Shahram Mostafazadeh, Santa Clara; Joseph O. Smith, Morgan Hill, both of Calif.

[73] Assignee: National Semiconductor Corporation, Santa Clara, Calif.

[21] Appl. No.: 526,733

[22] Filed: Sep. 11, 1995

[51] Int. Cl.$^6$ ............................................. H05K 7/20
[52] U.S. Cl. .................. 361/704; 165/80.2; 165/185; 257/707; 257/713; 257/796; 361/718
[58] Field of Search ................... 165/80.2, 185; 174/16.3; 257/693, 697, 706–707, 712, 713, 796; 361/704, 707, 709, 714–722; 437/215

[56] References Cited

U.S. PATENT DOCUMENTS 5,041,902  8/1991  McShane ........................ 257/706
5,285,352  2/1994  Pastore et al. ................... 257/712
5,365,107  11/1994 Kuraishi et al. ................. 257/712

FOREIGN PATENT DOCUMENTS 6097321  4/1994  Japan ............................. 257/796
6236944  8/1994  Japan ............................. 257/796

*Primary Examiner*—Gregory D. Thompson
*Attorney, Agent, or Firm*—Skjerven, Morrill, MacPherson, Franklin & Friel; Patrick T. Bever

[57] ABSTRACT

A ball grid array (BGA) package incorporating a heat sink member which includes a first portion mounted between an integrated circuit chip (die) and a package substrate, a second portion exposed on a surface of a molded plastic cover formed over the die and package substrate, and thermal conductors connected between the first portion and the second portion. Heat generated by the die is transmitted by the thermal conductors from the first portion to the second portion, and is dissipated outside of the BGA package.

19 Claims, 3 Drawing Sheets

5,598,321

BALL GRID ARRAY WITH HEAT SINK

BACKGROUND OF THE INVENTION

1. Field of the Invention

This invention relates to electronic devices such as integrated circuits and in particular to integrated circuit packages with enhanced thermal capabilities.

2. Description of the Prior Art

Present integrated circuit packages include ceramic and plastic ball grid arrays (BGAs) in which a ceramic or plastic substrate is electrically connected to an integrated circuit chip (die) using wire bonding, tape automated bonding (TAB), or controlled collapse chip connection ("C4" or "flip chip").

BGA packages are desirable because they are easier to surface mount on a printed circuit board (PCB) than fine pitch peripheral lead packages, such as quad flat pack (QFP) and dual in-line package arrangements, because the outer leads of BGA packages are distributed on the lower surface of the package, rather than being restricted to the package perimeter. Further, because BGA packages do not include peripheral leads, BGA packages take up less room on a host PCB, and may be closely spaced. This close spacing also allows for shorter interconnect lengths between packages, which results in improved electrical performance.

FIG. 1 is a cross-sectional view of a prior art BGA package 10 including an integrated circuit chip (die) 12 mounted on a substrate 14. Substrate 14 includes inner bonding pads 16 and outer bonding pads 18, and conductive lines (not shown) connecting inner bond pads 16 with outer bond pads 18. Wires 20 are connected between die bond pads 22, located on die 12, and inner bond pads 16. Die bond pads 22 are electrically connected to the integrated circuit fabricated on die 12. A plastic cover 24 is molded over die 12 and wires 20 for protection. Finally, solder balls 26 are connected to outer bond.pads 18 for electrical connection to a host PCB (not shown).

A problem with prior art BGA packages is that they have relatively poor heat-dissipation characteristics. Typically, heat generated by the die is transmitted through the substrate and solder balls to an underlying printed circuit board. However, in peripheral array BGA packages in which the solder balls are placed around a perimeter of the substrate (that is, not underneath the die), heat generated by the die becomes trapped within the package causing a substantial temperature increase. This is a particular problem with peripheral BGA arrays when a plastic substrate is used because the die is completely encapsulated in plastic, which is a poor heat conductor.

It is therefore highly desirable to provide a BGA package which provides improved heat dissipation.

SUMMARY OF THE INVENTION

In accordance with the present invention, a BGA package includes a heat dissipating structure (heat sink) which is integrally molded with the plastic cover of the BGA package and is partially exposed on an outer surface of the plastic cover. This heat dissipating structure improves the utility of BGA packages, particularly plastic BGA packages and peripheral array BGA packages, by providing substantially improved heat dissipation, thereby allowing these packages to support high heat-generating integrated circuit chips.

In accordance with one embodiment of the present invention, a copper frame includes a die attach pad which is located between the die and substrate of a BGA package. The die attach pad is connected by tie bars to heat dissipating surfaces which extend above the die and are exposed through a plastic molded cover protecting the die. Finally, electrical connections between the die and the substrate are provided by wire bonding.

In accordance with a second aspect of the present invention, a method is provided for producing a BGA package including bending a heat dissipating piece into a frame having a die attach pad defining a first plane, tie bars connected to the die attach pad and extending away from the die attach pad in the first plane, and bent heat dissipating portions protruding out of the first plane. The method further comprises placing the bent heat dissipating frame piece onto a substrate, attaching a die to the die attach pad, electrically connecting the die to the substrate by wire bonding, and forming a molded plastic cover over the die and wires such that the bent heat dissipating portions are exposed on a surface of the molded plastic cover.

BRIEF DESCRIPTION OF THE DRAWINGS

These and other features, aspects, and advantages of the present invention will become better understood with the following description, appended claims, and accompanying drawings where:

DESCRIPTION OF THE PREFERRED EMBODIMENT

In accordance with the present invention, a BGA package incorporates a heat dissipating (heat sink) member which includes a first portion mounted between an integrated circuit chip (die) and a package substrate, and a second portion exposed on a surface of a molded plastic cover formed over the die and package substrate. Heat generated by the die is transmitted by thermal conductors from the first portion to the second portion, and is dissipated outside of the BGA package. The heat dissipating member enhances the usefulness of BGA packages by allowing them to support high-heat-generating integrated circuits.

In accordance with a first embodiment of the present invention, the heat dissipating member is formed from a flat piece of thermally conductive material, such as copper, which is bent into a box-like frame.

Figure 1:
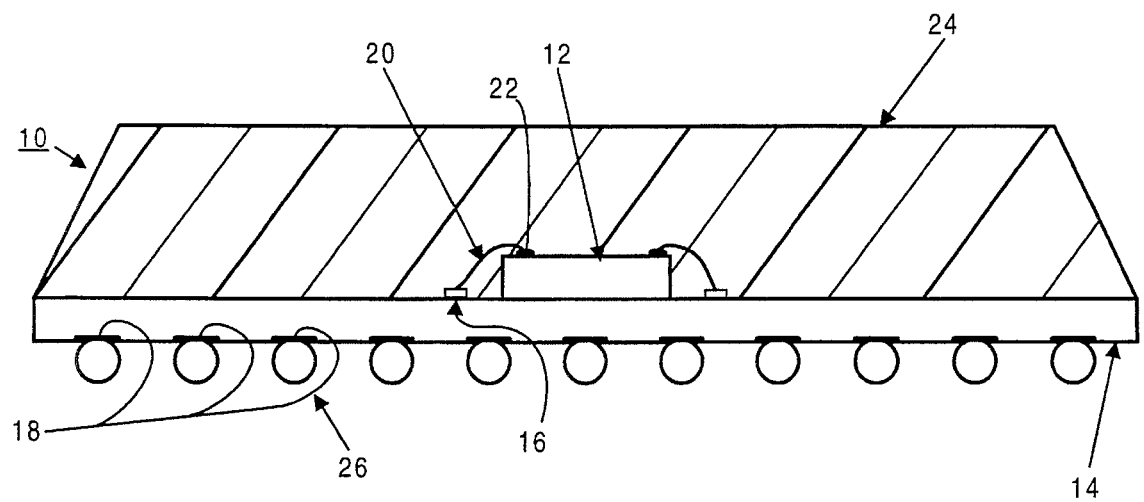
FIG. 1 is a section view of a conventional BGA package.
Figure 2:
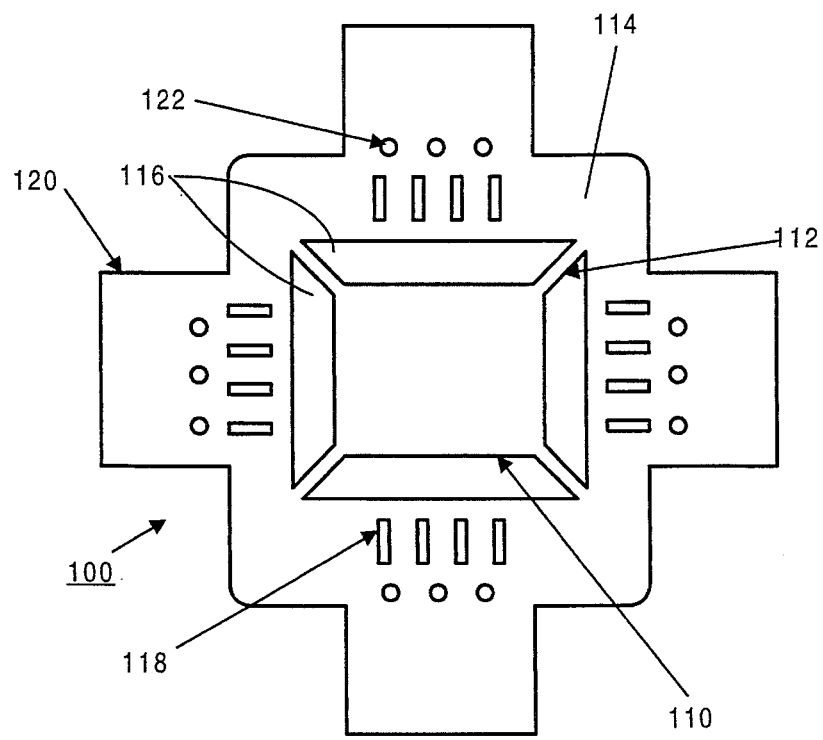
FIG. 2 is a plan view of a heat dissipating frame in accordance with an embodiment of the present invention.

FIG. 2 shows an integral heat dissipating member 100 in accordance with the first embodiment. Heat dissipating member 100 includes a square die attach pad (first portion) 110 which is connected by diagonally projecting tie bars (thermal conductors) 112 to a substantially square skirt 114. Of course, die attach pad 110 can alternatively be rectangular, or any other desired shape. Openings 116 are defined between die attach pad 110 and skirt 114. Slots 118 are formed in skirt 114 to enhance mechanical strength and to provide stress relief. The specific shape of the slots 118 can be varied from that shown in the figures. Flags 120 extend perpendicularly from skirt 114 and define locking holes 122. Skirt 114 and flags 120 make up a second portion of heat dissipating member 100. Heat dissipating member 100 may be stamped or etched from a sheet of, for example, copper or other thermally conductive material.

Figure 3:
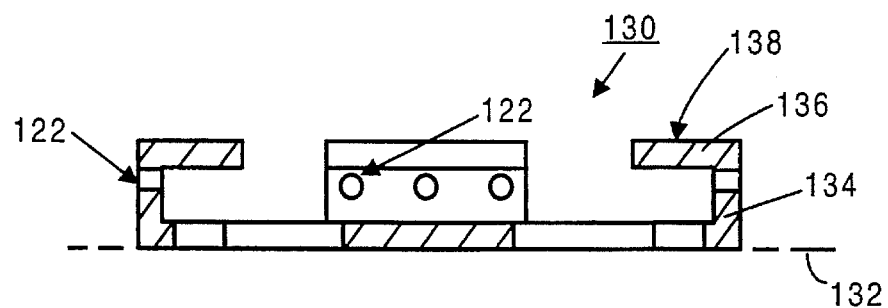
FIG. 3 is a section view showing the heat dissipating frame after bending.

FIG. 3 shows a heat dissipating frame 130 in accordance with a second embodiment of the present invention. Heat dissipating frame 130 defines a lower (first) plane 132 which contains die attach pad 110, tie bars 112 and skirt 114 (alternatively, tie bars 112 may be bent at an upwardly-directed angle such that skirt 114 is located above the lower plane 132). Flags 120 are bent to form sides 134 (perpendicular to the drawing sheet) which extend perpendicular to first plane 132, and upper portions 136 are bent from sides 134 which lie in an upper (second) plane 136 which is parallel to the lower plane 132. Sides 134 include locking holes 122 for securing heat dissipating frame 130 within a molded plastic cover (as described below). Upper portions 136 include upper surfaces 138 which are exposed on a BGA package after formation of a molded plastic cover, as described below. When incorporated into a BGA package, a die is positioned on die attach pad 110 such that the die is located between first plane 132 and second plane 136.

In accordance with a third embodiment of the present invention, a method is provided for forming a BGA package incorporating heat dissipating frame 130. This method is described with the aid of FIGS. 4–6.

Figure 4:
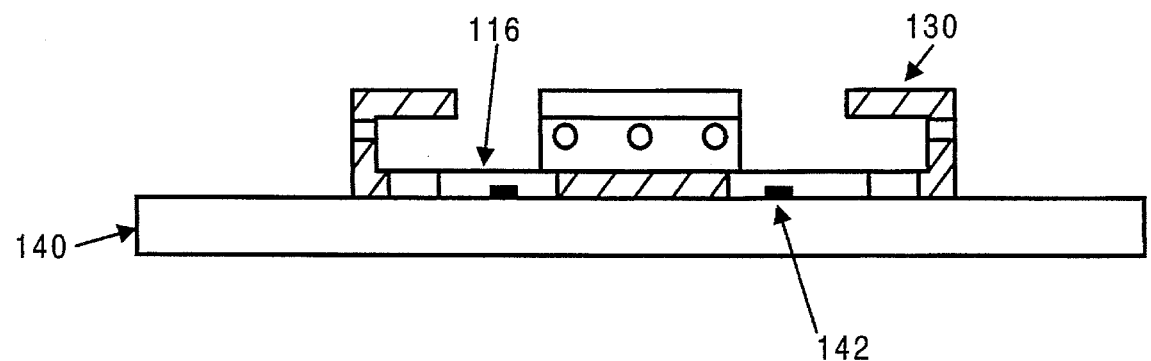
FIG. 4 is a section view of the heat dissipating frame of FIG. 3 mounted on a substrate.

Referring to FIG. 4, heat dissipating frame 130 is mounted onto a substrate 140 such that openings 116 are positioned over inner lead pads 142 of substrate 140. Heat dissipating frame 130 may be attached using a known die-attach epoxy or other attaching means. A central opening defined by upper portions 136 allow attachment of a die to die attach pad 110, which rests on substrate 140.

Figure 5:
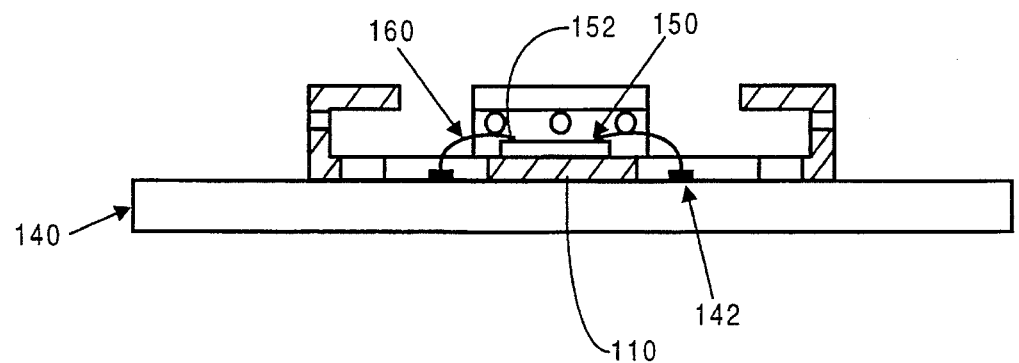
FIG. 5 is a section view showing a die mounted on the heat dissipating frame and connected to the substrate by wire bonding.

Referring to FIG. 5, a die 150 is mounted onto die attach pad 110 of heat dissipating frame 130 using a known die attach epoxy, and then die bond pads 152 are electrically connected to inner lead pads 142 by wires 160 using known wire bonding techniques. It is noted that upper portions 136 are located above an upper surface of die 150 such that, after encapsulation, the die 150 is completely covered by encapsulation materials, while upper portions 136 are exposed through the encapsulation material.

Figure 6:
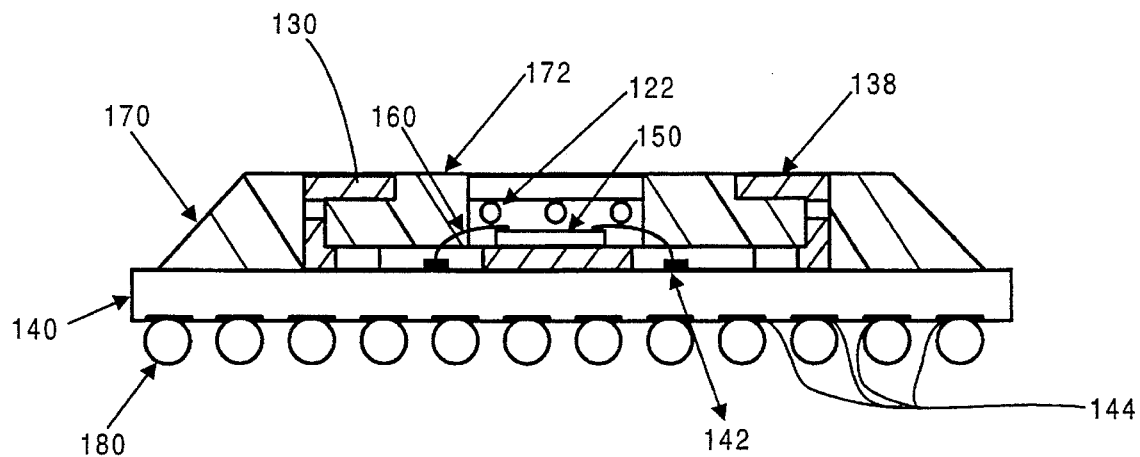
FIG. 6 is a section view showing a BGA package in accordance with the present invention.

Referring to FIG. 6, a molded cover 170 is then formed over heat dissipating frame 130, substrate 140, die 150 and wires 160 such that upper surfaces 138 are exposed through an upper surface 172 of molded cover 170, thereby allowing heat generated by die 150 to be dissipated outside of the BGA package. Molded cover 170 may be formed by known plastic molding processes or glob topping processes. Finally, solder balls 180 are attached to outer leads 144 of substrate 140 to allow mounting of the BGA package to a host PCB (not shown). Molding material enters holes 122 to help secure molded cover 170 to heat dissipating frame 130.

While particular embodiments of the present invention have been shown and described, it will be obvious to those skilled in the art that changes and modifications may be made without departing from this invention in its broader aspects. For example, heat dissipating frame 130 may be molded instead of being formed from the flat heat dissipating member 100 (see FIGS. 2 and 3), or assembled from separate pieces. In addition, heat dissipating frame 130 can be formed into any shape, provided it includes first portion located between die 150 and substrate 140, a second portion exposed on an exterior (side or top) of molded cover 170, and thermal conductors linking the first portion with the second portion. Further, heat dissipating frame 130 may be used in non-BGA package types, such as plastic quad flat pack (PQFP), plastic pin grid array (PPGA) packages, over molded PCMCIA modules, and other FR4 type substrates in which integrated circuits are similarly attached. Therefore, the appended claims are to encompass within their scope all such changes and modifications as fall within the true spirit and scope of this invention.

We claim:

1. An electronic device comprising:

a substrate including a plurality of inner lead pads formed on a surface thereof;

a heat dissipating member including a die attach pad mounted on the substrate, a second portion surrounding the die attach pad, and a plurality of thermal conductors thermally connecting the die attach pad with the second portion such that heat is transferred from the die attach pad to the second portion along the plurality of thermal conductors, wherein a plurality of openings are defined by an outer edge of the die attach pad, an inner edge of the second portion and the thermal conductors;

an integrated circuit chip mounted on the die attach pad such that heat generated by the integrated circuit chip is transferred to the die attach pad, the integrated circuit chip including a plurality of bonding pads, each of the plurality of bonding pads being electrically connected to one of the plurality of inner lead pads by a wire extending through one of the plurality of openings; and a molded cover formed over the substrate, the heat dissipating member and the integrated circuit chip.

2. The electronic device according to claim 1, wherein the die attach pad defines a first plane;

wherein the second portion includes a flat skirt surrounding the die attach pad, the second portion also including a plurality of side portions extending from the skirt in a direction perpendicular to the first plane, and a plurality of upper portions extending from the side portions and parallel to the first plane.

3. The electronic device according to claim 2, wherein the upper portions are exposed through an exterior surface of the molded cover.

4. The electronic device according to claim 2, wherein the skirt defines a plurality of slots.

5. The electronic device according to claim 2, wherein the side portions defines a plurality of holes.

6. The electronic device according to claim 2, wherein the heat dissipating member is formed from an integral sheet.

7. The electronic device according to claim 1, wherein the substrate includes a plurality of outer lead pads, each of the outer lead pads being electrically connected to one or more of the inner lead pads, and the electronic device further comprises a plurality of solder balls, each solder ball being connected to one of the plurality of outer lead pads.

8. An electronic device comprising:

a substrate including a plurality of inner lead pads formed on a first surface, and a plurality of outer lead pads formed on a second surface, each of the plurality of outer lead pads being electrically connected to one of the plurality of inner lead pads;

a heat dissipating member including a die attach pad mounted on the substrate, a second portion surrounding the die attach pad, and a plurality of thermal conductors thermally connecting the die attach pad with the second portion such that heat is transferred from the die attach pad to the second portion along the plurality of thermal conductors, wherein a plurality of openings are defined by an outer edge of the die attach pad, an inner edge of the second portion and the thermal conductors;

an integrated circuit chip mounted on the die attach pad such that heat generated by the integrated circuit chip is transferred to the die attach pad, the integrated circuit chip including bonding pads electrically connected to the inner lead pads by wire bonding;

a plurality of solder balls, each solder ball attached to one of the plurality of outer lead pads; and a molded cover formed over the first surface of the substrate, the heat dissipating member and the integrated circuit chip, the molded cover having an exterior surface;

wherein the second portion is exposed through the exterior surface of the molded cover.

9. The electronic device according to claim 8, wherein the flat die attach pad defines a first plane;

wherein the second portion includes a flat skirt surrounding the die attach pad, the second portion also including a plurality of side portions extending from the skirt in a direction perpendicular to the first plane, and a plurality of upper portions extending from the side portions and parallel to the first plane; and wherein the upper portions are exposed through the molded cover.

10. The electronic device according to claim 9, wherein the wire boding comprises wires connecting the inner lead pads with the bonding pads, and wherein each wire passes through one of the plurality of openings.

11. The electronic device according to claim 9, wherein the skirt defines a plurality of slots.

12. The electronic device according to claim 9, wherein the side portions defines a plurality of holes.

13. The electronic device according to claim 9, wherein the heat dissipating member is formed from an integral sheet.

14. A method for producing an electronic device, comprising the steps of:

mounting a heat dissipating frame onto a substrate, the heat dissipating frame including a die attach pad contacting a surface of the substrate, a second portion surrounding the die attach pad and extending from the surface of the substrate and a plurality of thermal conductors extending between first portion and the second portion such that heat is transferred from the die attach pad to the second portion along the plurality of thermal conductors, wherein a plurality of openings are defined by an outer edge of the die attach pad, an inner edge of the second portion and the thermal conductors, the substrate including first bond pads;

mounting a die on the die attach pad of the heat dissipating frame such that heat generated by the die is transferred to the die attach pad, the die having second bond pads;

electrically connecting the first bond pads to the second bond pads by wires such that each of the wires extends through one of the plurality of openings; and forming a molded cover over the substrate, die and heat dissipating frame such that the second portion of the heat dissipating frame is exposed on an outer surface of the molded cover.

15. The method according to claim 14, wherein the second portion of the heat dissipating frame includes a flat skirt located around the die attach pad, the second portion also including a plurality of flags extending from the skirt in a direction away from the substrate, and the step of mounting the heat dissipating frame further comprises:

bending the flags to form side portions which extend perpendicular to the skirt; and bending the side portions to form upper portions which extend perpendicular to the side portions and parallel to the skirt.

16. The method according to claim 15, wherein the step of mounting the heat dissipating frame further comprises aligning the heat dissipating frame such that at least some of the first bonding pads are exposed through the plurality of openings.

17. An electronic device comprising:

a substrate including a plurality of inner lead pads formed on a surface thereof, the surface of the substrate defining a first plane;

an integrated circuit chip mounted on the substrate, the integrated circuit chip including a plurality of bonding pads, each of the plurality of bonding pads being electrically connected to one of the plurality of inner lead pads by a wire;

a heat dissipating member in thermal enhancement with the integrated circuit chip, the heat dissipating member including side portions positioned along edges of the integrated circuit chip and extending in a direction perpendicular to the first plane; and a molded cover formed over the substrate, the heat dissipating member and the integrated circuit chip;

wherein the side portions of the heat dissipating member are embedded in the molded cover.

18. The electronic device according to claim 17, wherein the heat dissipating member further comprises a plurality of upper portions, each of the upper portions extending from one of the side portions in a direction parallel to the first plane.

19. The electronic device according to claim 17, wherein the plurality of upper portions are exposed through an exterior surface of the molded cover.

* * * * *